United States Patent
Ahn et al.

(10) Patent No.: US 9,913,381 B2
(45) Date of Patent: Mar. 6, 2018

(54) BASE SUBSTRATE WHICH PREVENTS BURRS GENERATED DURING THE CUTTING PROCESS AND METHOD FOR MANUFACTURING THE SAME

(71) Applicant: Point Engineering Co., Ltd., Asan-si, Chungcheongnam-do (KR)

(72) Inventors: Bum Mo Ahn, Yongin-si (KR); Seung Ho Park, Hwaseong-si (KR); Kyoung Ja Yun, Cheonan-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 377 days.

(21) Appl. No.: 14/460,587

(22) Filed: Aug. 15, 2014

(65) Prior Publication Data

US 2015/0049447 A1 Feb. 19, 2015

(30) Foreign Application Priority Data

Aug. 16, 2013 (KR) .................. 10-2013-0097185

(51) Int. Cl.
*H05K 1/18* (2006.01)
*H05K 3/00* (2006.01)
(Continued)

(52) U.S. Cl.
CPC ............ *H05K 3/0052* (2013.01); *H01L 33/48* (2013.01); *H01L 33/62* (2013.01);
(Continued)

(58) Field of Classification Search
CPC .......... H05K 2201/09718; H05K 2201/09863; H05K 2201/09854; H05K 2201/09845; H05K 2201/09827; H05K 2201/10
(Continued)

(56) References Cited

U.S. PATENT DOCUMENTS

| 2004/0120128 A1* | 6/2004 | Chang ............... H01L 23/13 361/764 |
| 2005/0124232 A1* | 6/2005 | Tabrizi ............ H01L 23/13 439/862 |
| 2010/0155769 A1* | 6/2010 | Lin ................. H01L 21/486 257/99 |

FOREIGN PATENT DOCUMENTS

KR 10-2011-0096315 8/2011 ............ H01L 33/62

OTHER PUBLICATIONS

Korean Intellectual Property Office, Office Action—Notification of Grounds for Rejection for Application No. 10-2013-0097185, dated Aug. 26, 2014, 4 pages.
(Continued)

*Primary Examiner* — Binh Tran
(74) *Attorney, Agent, or Firm* — Sunstein Kann Murphy & Timbers LLP

(57) ABSTRACT

A base substrate which prevents burrs generated during the cutting process includes: multiple conductive layers stacked in one direction with respect to the base substrate; at least one insulation layer being alternately stacked with said conductive layers and electrically separating said conductive layers; and a through-hole penetrating said base substrate covering said insulation layer at the contact region where said cut surface and said insulation layer meet during the cutting of said base substrate in accordance with a predetermined region of the chip substrate. A method of manufacturing the base substrate includes alternately stacking conductive layers and insulation layers and forming a through-hole.

3 Claims, 9 Drawing Sheets

(51) Int. Cl.
   *H05K 7/00* (2006.01)
   *H01L 33/48* (2010.01)
   *H01L 33/62* (2010.01)
(52) U.S. Cl.
   CPC ...... *H01L 2924/0002* (2013.01); *H05K 1/183* (2013.01); *H05K 2201/09718* (2013.01); *H05K 2201/09827* (2013.01); *H05K 2201/09845* (2013.01); *H05K 2201/09854* (2013.01); *H05K 2201/09863* (2013.01); *H05K 2201/10* (2013.01); *H05K 2201/10106* (2013.01); *H05K 2201/10121* (2013.01); *Y10T 29/49155* (2015.01)
(58) Field of Classification Search
   USPC ......... 361/760, 761, 762; 174/255, 258, 262
   See application file for complete search history.

(56) References Cited

OTHER PUBLICATIONS

Korean Intellectual Property Office, Office Action—Notification of Grounds for Rejection for Application No. 10-2013-0097185, dated Aug. 26, 2014, 3 pages (English translation).

\* cited by examiner

BASE SUBSTRATE WHICH PREVENTS BURRS GENERATED DURING THE CUTTING PROCESS AND METHOD FOR MANUFACTURING THE SAME

The present application claims priority from Korean application no. 10-2013-0097185, filed Aug. 16, 2013, the full disclosure of which is hereby incorporated by reference herein.

TECHNICAL FIELD

The present invention relates to a base substrate and a method for manufacturing the same, more particularly to a base substrate where the optical device chips are mounted thereon.

BACKGROUND ART

LED is being used as the light source of a back light unit (BLU) for a liquid crystal display (LCD) which is used in the flat panel displays such as TVs, computer monitors, and the like.

An optical device chip such as an LED is being mounted on the base substrate for an optical device, and the individual optical devices are manufactured through a separation process i.e. sawing or dicing of the base substrate for the optical devices.

However, according to the conventional methods, burrs are generated during the sawing process or the dicing process, and there has been a problem of generating an electrical short due to the situation wherein the burrs, which are generated due to the difference in the hardness between the material constituting the conductive layer and the material constituting the insulation layer, are crossing over the insulation layer and the like.

SUMMARY OF EMBODIMENTS

Technical Problem

Embodiments of the present invention suggest solving the above described problems of the prior art by providing a configuration of a base substrate which may not generate burrs during the separation process of the optical devices from the base substrate, i.e. a sawing or a dicing process.

More particularly, the purpose is to provide a configuration which may not generate burrs during the separation process of the optical device by forming a predetermined through-hole with respect to the cross-section of the optical device.

Solution to Problem

To solve the above described problems, a base substrate which prevents burrs generated during the cutting process includes: multiple conductive layers stacked in one direction with respect to the base substrate; at least one insulation layer being alternately stacked with said conductive layers and electrically separating said conductive layers; and a through-hole penetrating said base substrate covering said insulation layer at the contact region where said cut surface and said insulation layer meet during the cutting of said base substrate in accordance with a predetermined region of the chip substrate.

It is advantageous in that the through-hole surface of said base substrate made by said through-hole is formed inward direction with respect to the cut surface of said base substrate covering said insulation layer.

Said base substrate which prevents burrs generated during the cutting process further includes a cavity comprising a concave pit downwardly reaching from the upper surface of said base substrate to a predetermined depth with respect to the region covering said insulation layer.

Said base substrate which prevents burrs generated during the cutting process further includes a resistor section for preventing the performance degradation of insulation capability of said insulation layer which is being exposed at the lower surface of said base substrate.

Said base substrate which prevents burrs generated during the cutting process further includes an optical device chip which is mounted on said base substrate inside (within) said cavity.

It is advantageous in that said optical device chip is bonded to any one conductive layer from said conductive layers being separated by said insulation layer inside said cavity.

It is advantageous in that one electrode of said optical device chip is electrically connected to other conductive layer where said optical device chip is not bonded thereto among said conductive layers.

Said base substrate which prevents burrs generated during the cutting process further includes an electrode indication marker on the upper surface of said base substrate for indicating the electrode for at least any one electrode layer among said conductive layers being separated by said insulation layer.

To solve the above described problems, a method for manufacturing a base substrate which prevents burrs generated during the cutting process according to the present invention includes the steps of: alternately stacking the multiple conductive layers and at least one insulation layer, which is for electrically separating said conductive layers, in one direction with respect to the base substrate; and forming a through-hole penetrating said base substrate covering said insulation layer at the contact region where said cut surface and said insulation layer meet during the cutting of said base substrate in accordance with a predetermined region of the chip substrate.

It is advantageous in that the through-hole surface of said base substrates made by said through-hole is formed inward direction with respect to the cut surface of said base substrate covering said insulation layer.

A method for manufacturing a base substrate which prevents burrs generated during the cutting process further includes a step of forming a cavity prior to the step of forming said through-hole or forming a cavity comprising a concave pit downwardly reaching from the upper surface of said base substrate, wherein said through-hole is formed, to a predetermined depth with respect to the region covering said insulation layer.

It is an advantage if no burrs are generated during the separation process of the optical device from the base substrate i.e. sawing or dicing process. By forming predetermined through-holes covering the insulation layer with respect to the cut surface of the optical device generation of burrs can be minimized or eliminated.

DESCRIPTION OF EMBODIMENTS

Contents of the description below merely exemplify the principle of the invention. Therefore those of ordinary skill in the art may implement the theory of the invention and invent various apparatuses which are included within the concept and the scope of the invention even though it is not clearly explained or illustrated in the description. Furthermore, in principle all the conditional terms and embodiments listed in this description are clearly intended for the purpose of understanding the concept of the invention, and one should understand that this invention is not limited to such specially listed exemplary embodiments and the conditions.

The above described objectives, features, and advantages will be more apparent through the following detailed description related to the accompanying drawings, and thus those of ordinary skill in the art may easily implement the technical spirit of the invention. Hereinafter, a preferred exemplary embodiment according to the present invention will be described with reference to the accompanying drawings.

Figure 1A:
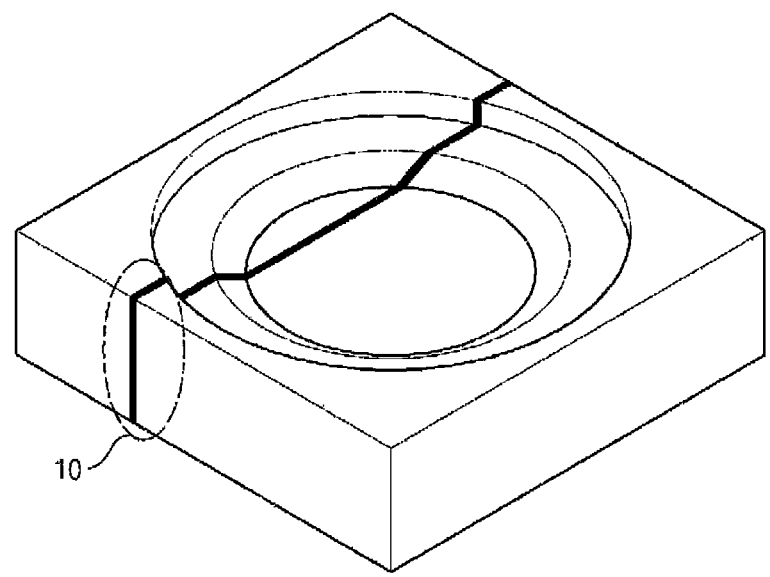
FIGS. 1a, 1b, 1c, and 1d are the exemplary drawings showing the burr generation problems of the prior art.

FIGS. 1a, 1b, 1c, and 1d are the exemplary drawings showing the burr generation problems that are to be solved in embodiments of the present invention. FIG. 1a is a perspective view showing a single chip substrate formed through the cutting process of the chip substrate.

Figure 1B:
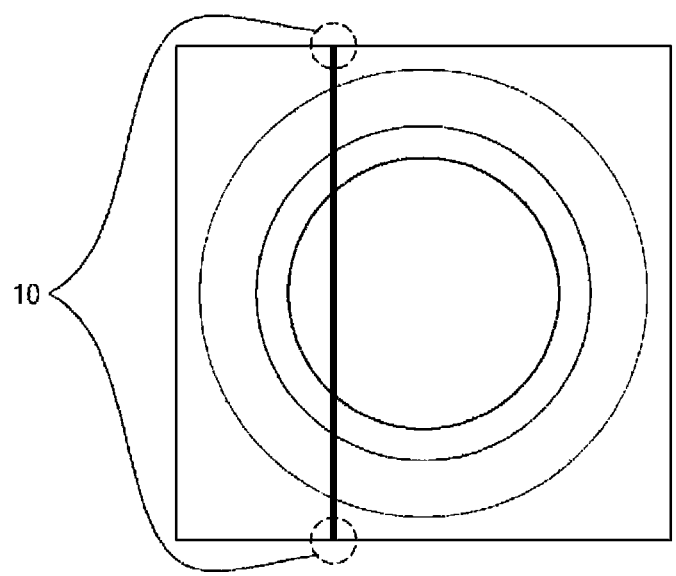
Figure 1C:
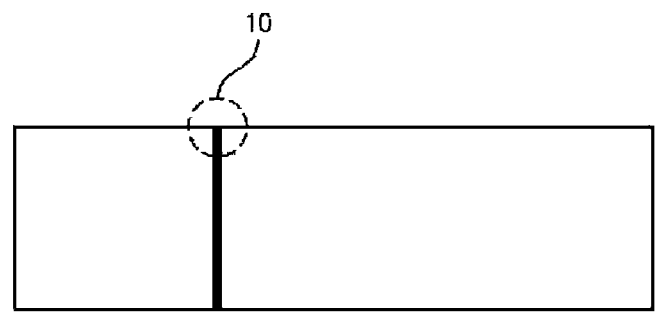
Figure 1D:
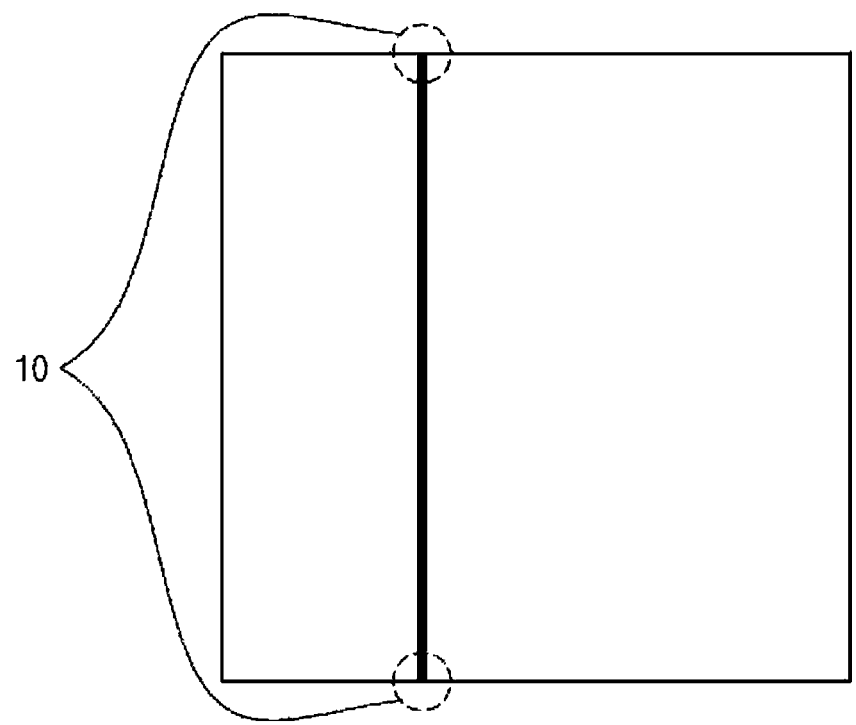

In an exemplary embodiment of the present invention, the base substrate is an array of chip substrates comprising multiple chip substrates having a predetermined size, and it is utilized by cutting the base substrate into each individual chip substrates. At this time, the cross-section 10 is formed to have a front view as shown in FIG. 1b, a side view as shown in FIG. 1c, and a rear view as shown in FIG. 1d. Due to the cutting process as shown in the above described drawings burrs are generated during sawing or dicing which damages the insulation layer being formed as a very thin layer, therefore there is a problem of occurring failure such as a short which is caused by the insulation breakdown of the substrate.

A base substrate which may not generate burrs during the separation process of an optical device i.e. sawing or dicing process, more particularly a configuration of a chip substrate being configured on a base substrate is proposed. Hereinafter, a method for manufacturing a base substrate which prevents burrs generated during the cutting process, and a base substrate manufactured by using the method will be described with reference to FIG. 2.

Figure 2:
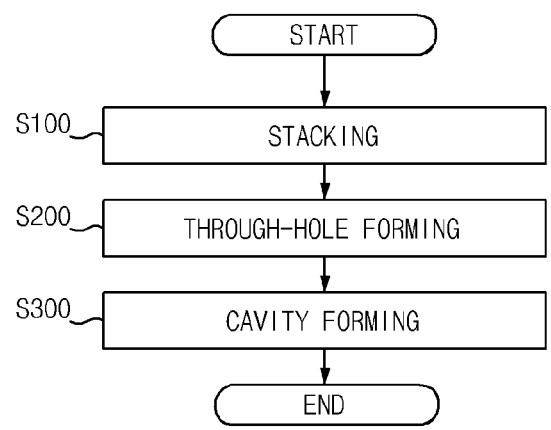
FIG. 2 is a flow diagram showing a method for manufacturing a base substrate which prevents burrs generated during the cutting process according to an exemplary embodiment of the present invention.

FIG. 2 shows a method for manufacturing a base substrate which prevents burrs generated during the cutting process according to an exemplary embodiment of the present invention. With reference to FIG. 2, a method for manufacturing a base substrate includes a stacking step S100, a through-hole forming step S200, and a cavity forming step S300.

In the stacking step S100, the multiple conductive layers and at least one insulation layer, which is for electrically separating said conductive layers, are alternately stacked in one direction with respect to the base substrate.

Figure 3A:
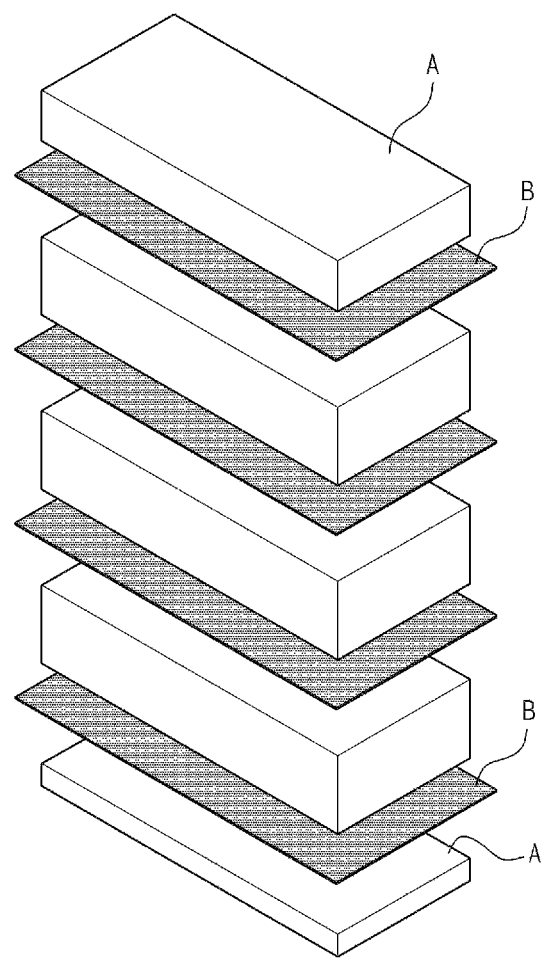
FIGS. 3a, 3b, and 3c are exemplary drawings for explaining the manufacturing process of a base substrate according to an exemplary embodiment of the present invention.

As shown in FIG. 3a, first, multiple conductive layers A containing electrically conductive materials and having a predetermined thickness are alternately stacked by bonding with insulation layers B comprising the insulation material and being interposed therebetween.

Figure 3B:
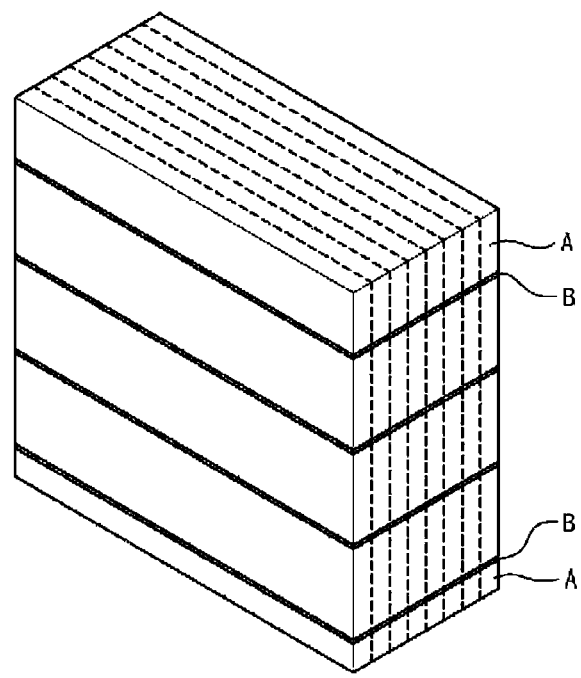

By heating and compressing while they are being stacked, a lump of conductive material wherein multiple insulation layers B are arranged with a distance is produced as shown in FIG. 3b.

Figure 3C:
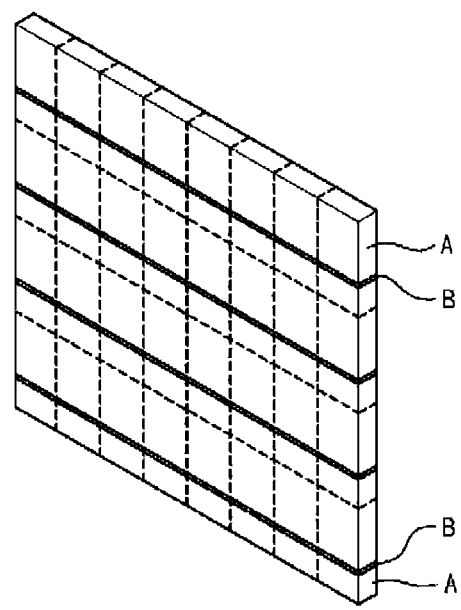

Next, by vertically cutting the lump of conductive material produced using such a way including the insulation layers B as illustrated using dotted line in FIG. 3b, the manufacturing process of the base substrate wherein multiple vertical insulation layers B are arranged in parallel with a distance is completed as shown in FIG. 3c. In other words, one direction of an exemplary embodiment is a vertical direction, and a base substrate is manufactured by vertically cutting thereof along the direction of stacking. The dotted lines in FIG. 3c represent the cutting lines for forming every individual chip substrates. Hereinafter the through-hole forming step S200 for the chip substrates manufactured in the stacking step will be explained.

In the through-hole forming step S200 of an exemplary embodiment of the present invention, a through-hole penetrating said base substrate covering said insulation layer B at the region where the cut surface and said insulation layer are in contact when cutting said base substrate in accordance with a predetermined chip substrate area.

Figure 4A:
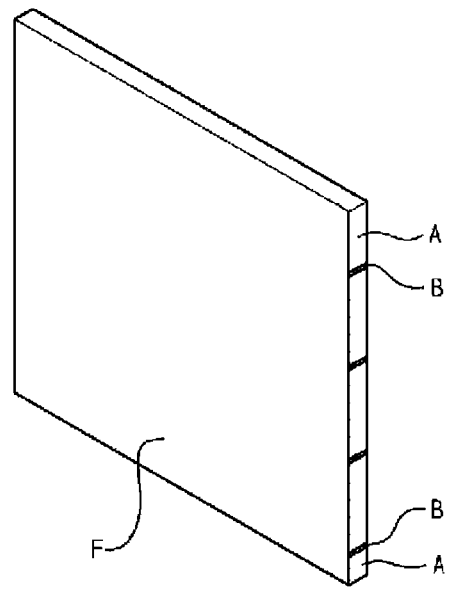
FIGS. 4a, 4b, and 4c are exemplary drawings for explaining the manufacturing process of a base substrate according to an exemplary embodiment of the present invention.
Figure 4B:
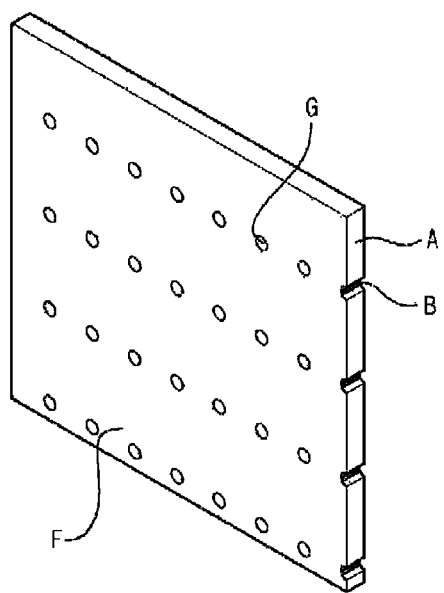
Figure 4C:
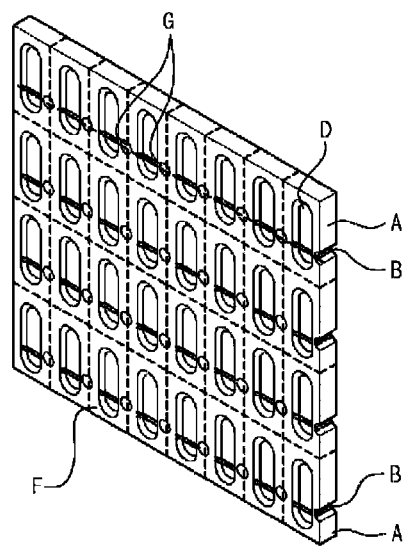

With reference to FIG. 4c, in the through-hole forming step S200 of an exemplary embodiment of the present invention a through-hole penetrating said base substrate covering said insulation layer B at the region where the cut surface and said insulation layer are in contact when cutting said base substrate with respect to the base substrate illustrated in FIG. 3c.

Further, a cavity D is formed after the through-hole is formed through the cavity forming step S300. Otherwise, in accordance with the manufacturing process, the through-hole G may be formed together with the cavity D, or the through-hole G may also be formed after the cavity D is formed.

In the cavity forming step S300 of an exemplary embodiment of the present invention, a space comprising a concave pit downwardly reaching from the upper surface of said base substrate to a predetermined depth with respect to the region covering said insulation layer B is formed.

A cavity D, which is downwardly reaching from the upper surface of the chip substrate to a predetermined depth, is formed by, for example, machining and the like, and in this case the vertical insulation layer B must pass through the bottom of the cavity D. It is advantageous in that the cavity D is formed to have a downwardly narrowing taper.

In addition, with reference to FIG. 4a, in the through-hole forming step S200 of an exemplary embodiment of the present invention, a through-hole G may also be formed in a base substrate wherein a resist F is deposited thereon. With reference to FIG. 4a, in an exemplary embodiment of the present invention, a solder resist F, preferably a white solder resist having a good optical reflecting performance, may be deposited on the upper and the lower surfaces of the base substrate respectively prior to forming of the through-hole.

FIG. 4a is a perspective view of a base substrate wherein a solder resist is deposited in such a way. It is provided for preventing not only from being contaminated and getting dirty due to the crossing of the solder paste along the chip substrate during the soldering of an optical device chip, preferably an LED chip, on the printed circuit board, but also from degrading of insulation performance; on the other hand, waste of the plating material is reduced and the optical reflecting performance is enhanced.

With reference to FIG. 4b, a through-hole penetrating said base substrate covering said insulation layer B at the region where the cut surface and said insulation layer B are in contact when cutting the base substrate in accordance with the predetermined area of the chip substrate, is formed.

Figure 5A:
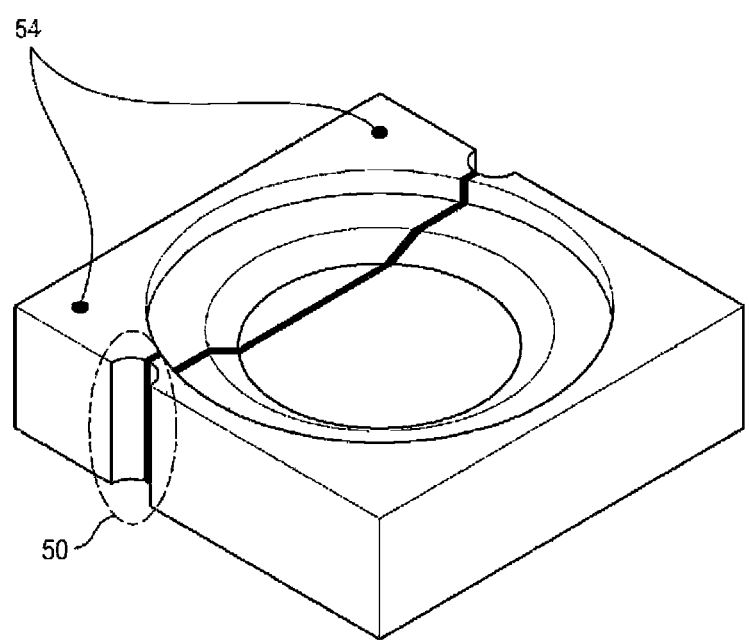
FIGS. 5a, 5b, 5c, and 5d are the exemplary drawings showing a base substrate which prevents burrs generated during the cutting process according to an exemplary embodiment of the present invention.

A chip substrate formed by cutting the base substrate wherein a through-hole and a cavity are formed according to the above exemplary embodiment, is shown in FIG. 5a.

FIG. 5a is a perspective view illustrating a chip substrate which prevents burrs generated during the cutting process according to an exemplary embodiment of the present invention.

With reference to FIG. 5a, a chip substrate according to an exemplary embodiment of the present invention includes a conductive layer A, an insulation layer B, and a through-hole.

A conductive layer A is formed by being stacked along 'one direction' with respect to the base substrate. In here, 'one direction' is determined in accordance with the stacking direction of the conductive layer A which is alternately stacked with the insulation layer B in the stacking step as described above. In other words, for a case shown in FIG. 5a, a chip substrate is cut off again from the base substrate which is cut off after being stacked as shown in the perspective view, and the conductive layer A and the insulation layer B appear to be alternately stacked in the horizontal direction.

The insulation layer B is alternately stacked with the conductive layer A, thereby electrically separating the conductive layer A. In other words, the chip substrates being isolated with the interposed insulation layer B therebetween may function as a positive (+) electrode terminal, and a negative (−) electrode terminals respectively.

A through-hole penetrates said base substrate covering said insulation layers B at the contact region where said cut surface and said insulation layer B meet during the cutting of said base substrate in accordance with a predetermined region of the chip substrate. In the exemplary embodiment, a through-hole may be formed through drilling as a hole-making process in a substrate state. In other words a through-hole penetrating the substrate is formed in a substrate state as shown in the above described in FIGS. 4b and 4c.

Further, in the exemplary embodiment of the present invention, a through-hole penetrates covering the insulation layer B, and 'covering the insulation layer B' could mean that a through-hole having a larger diameter or a wider width than the thickness of the insulation layer B is formed. In other words, a through-hole penetrates through the insulation layer B in a substrate state. Since hole-making is used in forming a through-hole, generation of burrs during the cutting of the insulation layer B in a conventional sawing or dicing process, may be prevented.

In an exemplary embodiment of the present invention, the cutting plane of said base substrate by the through-hole is formed towards the inward direction with respect to the cut surface 50 cut off from said base substrate covering said insulation layer B. In other words, with reference to FIG. 5a or the front view FIG. 5b, the rear view FIG. 5d, and compared with FIG. 1a, 1b, or 1c, the cut surface 50 is concavely formed towards the inward direction covering the portion where the insulation layer B is formed.

Further, as described above, the chip substrate which has undergone the cavity forming step S300 according to an exemplary embodiment of the present invention includes a space comprising a concave pit downwardly reaching from the upper surface of the base substrate to a predetermined depth with respect to the region covering said insulation layer B is formed. As described above, it is advantageous in that the cavity D is formed to have a downwardly narrowing taper. In an exemplary embodiment of the present invention, a chip substrate is manufactured by cutting off the base substrate, wherein the multiple through-holes and the cavities D are formed therein, in accordance with a predetermined chip substrate region.

Further, an optical device chip is mounted inside the cavity of the chip substrate. After the plating is completed the optical device chips are mounted inside of the each individual cavities D of the base substrate, and then wire bonded for bonding to any one conductive layer A of the separated (isolated) conductive layers A by the isolation layer. In addition, one electrode of the optical device chip is electrically connected to other conductive layer A of said conductive layers A wherein said optical device chip is not bonded thereto.

Next, individual chip substrates as shown in FIGS. 5a to 5d are manufactured by cutting off the base substrate (cut in the horizontal direction) spaced apart by the length of the chip substrate along the cut lines of the base substrate. The cutting order of the complete cutting process for the partial cutting portion and the cutting process for cutting the substrate spaced apart by the chip length can be interchanged, and such cutting processes may be performed after fixing the bottom of the base substrate with an adhesive tape and the like.

Figure 5B:
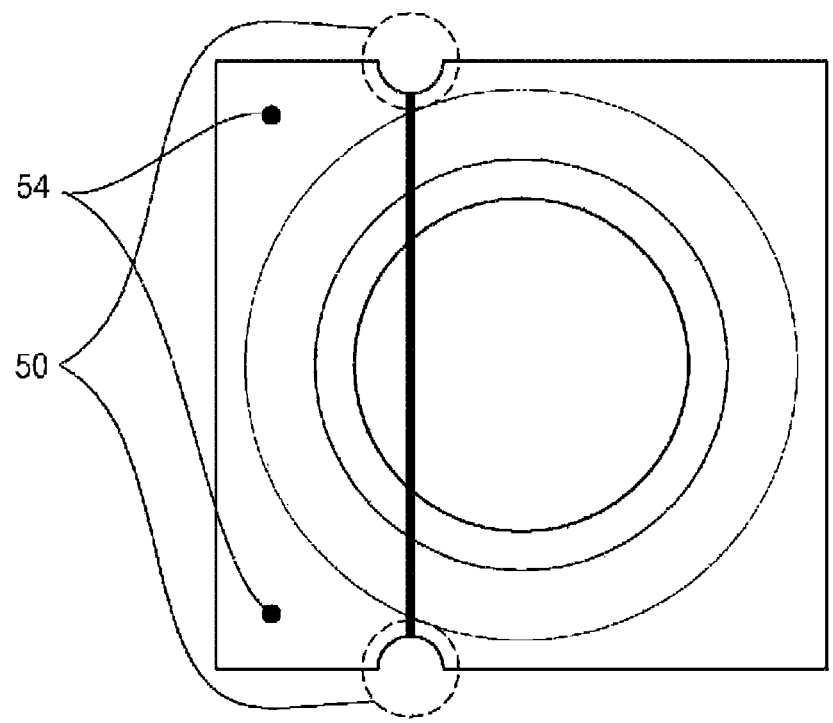
Figure 5C:
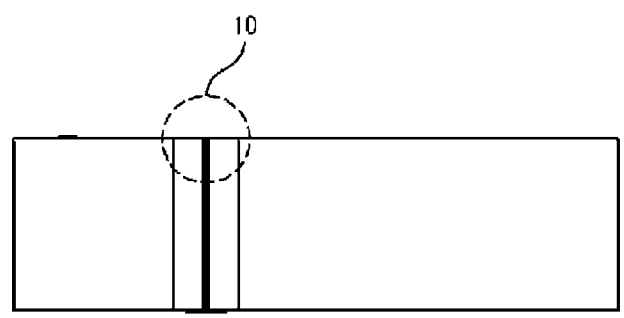
Figure 5D:
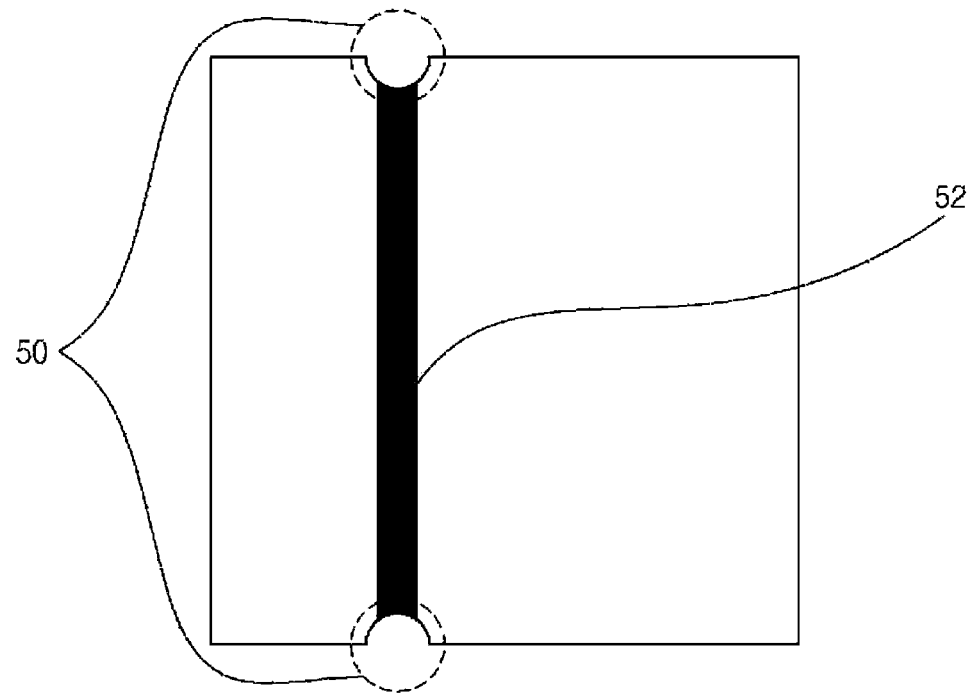

In addition, with reference to FIG. 5d, under the base substrate according to an exemplary embodiment of the present invention, a resist portion 52, where solder resist is deposited on the exposed area of the insulation layer under the base substrate, is further included in order to prevent performance degradation due to the infiltration of the solder paste into the insulation layer when depositing solder paste for soldering the manufactured chip substrate, thereby avoiding the deposition of solder paste thereon. Further, as shown in FIGS. 5a and 5b, an electrode indication marker 54 may further included for indicating the electrode as an anode or a cathode for at least two conductive layers which is divided by the insulation layer in the chip substrate.

Above description is merely an exemplary description of the technical spirit of the present invention, and various modifications, changes, and substitutions are possible for a person of skill in the art within the scope without deviating from the fundamental characteristics of the present invention.

Therefore, the exemplary embodiment and the accompanying drawings disclosed in the present invention is for explanation and not for limiting the technical spirit of the present invention, and the scope of the technical spirit of the present invention is not limited by these exemplary embodiments and the accompanying drawings. The scope of protection of the present invention must be interpreted according to the following claims, and it must be interpreted in such a way that all the technical spirits within the equivalent scope of the present invention are included in the scope of the rights of the present invention.

What is claimed is:

1. An uncut substrate having an upper surface and a lower surface, the substrate comprising:
   a plurality of conductive layers arranged laterally in one direction;
   at least one vertical insulation layer interposed between and laterally adjacent to the conductive layers so as to electrically separate the conductive layers from one another;
   a plurality of cavities, each of which comprising a concave pit downwardly reaching from the upper surface of the uncut substrate to a predetermined depth at a region of the upper surface including a portion of the insulation layer; and
   a plurality of through holes that are empty inside,
   wherein the uncut substrate is partitioned into a plurality of unit substrate areas arranged in a two-dimensional array along a plurality of rows and a plurality of columns, each of the unit substrate areas accommodating one of the cavities at a central region thereof,
   wherein each of the through holes is located on one of border lines between the plurality of columns, and completely penetrates a portion of the vertical insulation layer and a portion of the conductive layers adjacent to the portion of the insulation layer from the upper surface to the lower surface so as to prevent generation of burrs in case of the uncut substrate being cut along the border lines between the plurality of columns.

2. The uncut substrate according to claim 1, further comprising a resist portion to prevent an exposed portion of the insulation layer from being deteriorated in insulation property.

3. The uncut substrate according to claim 1, further comprising an electrode indication marker on the upper surface of the uncut substrate to mark one of the conductive layers.

* * * * *